(12) United States Patent
Tanaka

(10) Patent No.: US 6,339,318 B1
(45) Date of Patent: Jan. 15, 2002

(54) SEMICONDUCTOR INTEGRATED CIRCUIT DEVICE

(75) Inventor: Hitoshi Tanaka, Ome (JP)

(73) Assignees: Hitachi, Ltd.; Hitachi ULSI Systems Co., Ltd., both of Tokyo (JP)

( * ) Notice: Subject to any disclaimer, the term of this patent is extended or adjusted under 35 U.S.C. 154(b) by 0 days.

(21) Appl. No.: 09/599,733

(22) Filed: Jun. 23, 2000

(30) Foreign Application Priority Data

Jun. 23, 1999 (JP) ............................................. 11-176629

(51) Int. Cl.[7] .......................... H03K 17/16; G05F 3/20; G05F 3/02
(52) U.S. Cl. .......................... 323/313; 326/30; 327/541
(58) Field of Search .............................. 323/313, 312, 323/314, 315; 307/451, 481; 326/85, 83, 87, 86, 30, 68; 327/393, 541, 108

(56) References Cited

U.S. PATENT DOCUMENTS

| | | | | |
|---|---|---|---|---|
| 5,019,729 A | * | 5/1991 | Kimura et al. | 307/475 |
| 5,099,151 A | * | 3/1992 | Watanabe | 326/68 |
| 5,729,154 A | * | 3/1998 | Taguchi et al. | 326/30 |
| 5,729,158 A | * | 3/1998 | Raajivan et al. | 326/87 |

FOREIGN PATENT DOCUMENTS

| | | |
|---|---|---|
| JP | 1161513 | 6/1989 |
| JP | 442313 | 2/1992 |
| JP | 4119589 * | 4/1992 |

OTHER PUBLICATIONS

Information and communication Engineers, Prepared Papers for the 1990 Autumn Convention, vol. 5, p. 252, No Date.

* cited by examiner

*Primary Examiner*—Rajnikani B. Patel
(74) *Attorney, Agent, or Firm*—Antonelli, Terry, Stout & Kraus, LLP

(57) ABSTRACT

A semiconductor circuit device equipped with an intermediate voltage generating circuit having achieved circuitry simplification and a saving in power consumption is to be provided. In a semiconductor integrated circuit containing within its chip a voltage generating circuit for generating an external source voltage VDD or a voltage which is half of a voltage internally generated on the basis of that external voltage, the voltage generating circuit consisting of two sets of differential circuits for comparing a reference voltage and the output voltage of a push-pull output circuit and driving the output transistor of the push-pull output circuit, and the differential circuits being provided with offsets to prevent a penetrating current from flowing to the push-pull output circuit. The offsets are formed by differentiating the channel width/channel length ratios or the threshold voltages of differential pairs of MOSFETs. The bias currents of the differential circuits are made proportional to the respective load currents.

24 Claims, 6 Drawing Sheets

SEMICONDUCTOR INTEGRATED CIRCUIT DEVICE

FIELD OF THE INVENTION

The present invention relates to a semiconductor integrated circuit device, and more particularly to a technology which can be effectively utilized in a semiconductor integrated circuit device containing, for instance, a dynamic random access memory (RAM) with a built-in intermediate voltage generating circuit formed by dividing the source voltage.

BACKGROUND OF THE INVENTION

A dynamic RAM (DRAM) requires a circuit for generating a voltage HVDL, which is half the bit line voltage VDL for precharging bit lines or biasing memory cell plates. Capacities of DRAMs have been increased progressively in recent years, resulting in designs on a gigabit scale. Such a large-capacity DRAM requires a circuit system capable of supplying a large current because the capacities of bit lines and memory cell plates therein reach hundreds of nF.

FIG. 6 illustrates a bit line precharging voltage generating circuit according to the prior art. This circuit is described in The Institute of Electronics, Information and Communication Engineers, *Prepared Papers for the* 1990 *Autumn Convention* (in Japanese), Vol. 5, p. 252. It basically consists of a push-pull load driving circuit comprising a P-channel type MOSFET and an N-channel type MOSFET, and two error amplifiers A1 and A2 for individually driving them. The operating currents of these amplifiers A1 and A2 are controlled by the outputs of smaller amplifiers A3 and A4, respectively.

Into this circuit are entered two different voltages, resulting from the division of a source voltage VCC by a resistor, as reference voltages for determining its output voltage Vout. Of the two reference voltages, the lower one V1 is entered into the amplifier A1 for driving the P-channel type MOSFET, while the higher voltage V2 is entered into the amplifier A2 for driving the N-channel type MOSFET. This results in the formation of an insensitive region in the relationship between the output voltage and the output amperage of this circuit as shown in FIG. 2. This insensitive region is intended to prevent a constant penetrate penetrating current from passing the P-channel type MOSFET and the N-channel type MOSFET.

This circuit is further provided with the amplifiers A3 and A4 smaller than the amplifiers A1 and A2 both in device size and in amperage. One (+) of the input terminals of each of these smaller amplifiers A3 and A4 is supplied with the output voltage Vout of this circuit. The other input (−) of the smaller amplifier A3 is supplied, if it matches the P-channel type MOSFET, with a voltage lower than the voltage V1, and that matching the N-channel type MOSFET, with a voltage V4 higher than the voltage V4.

When a load current flows with the result of a drop in the output voltage Vout beyond the input voltage V3 of the smaller amplifier A3, its output signal takes on a low level and the output of a NAND gate circuit, a high level. This increases the operating current of the amplifier forming the gate voltage of the P-channel type MOSFET to quickly reduce the gate voltage of the P-channel type MOSFET toward the low level. As a result, the output voltage Vout rises to return to its original level. Conversely, the inflow of a load current results in a rise in the output voltage Vout beyond the input voltage V4 of the smaller amplifier A3, its output signal takes on a high level and the output of the NOR gate circuit, a low level. This increases the operating current of the amplifier A2 forming the gate voltage of the N-channel type MOSFET to quickly raise the gate voltage of the N-channel type MOSFET toward the high level. As a result, the output voltage Vout drops and returns to its original level.

However, this circuit indispensably requires resistors because as many as four different accurate reference voltages V1 through V4 are needed to generate the insensitive region and to detect the level of current switching. There is involved another problem that resistance elements of high resistances are required to reduce the currents flowing to the resistors, and they occupy a relatively large space. Furthermore, a current should be flowed all the time to detect the level of current switching, inviting a correspondingly greater consumption of power.

An object of the present invention is to provide a semiconductor integrated circuit device equipped with an intermediate voltage generating circuit which can achieve circuitry simplification and a saving in power consumption. Another object of the invention is to provide a semiconductor integrated circuit device equipped with an intermediate voltage generating circuit which consumes less power and excels in responsiveness. These and other objects and novel characteristics of the invention will become apparent from the description in this specification when taken in conjunction with the accompanying drawings.

SUMMARY OF THE INVENTION

To briefly describe some typical aspects of the invention disclosed in this patent application, a semiconductor integrated circuit containing within its chip a voltage generating circuit for generating an external source voltage VDD or a voltage which is half a voltage internally generated on the basis of that external voltage, the voltage generating circuit consisting of two sets of differential circuits for comparing a reference voltage and the output voltage of a push-pull output circuit and driving the output transistor of the push-pull output circuit, and the differential circuits being provided with offsets to prevent a penetrating current from flowing to the push-pull output circuit. The offsets are formed by differentiating the channel width/channel length ratios or the threshold voltages of differential pairs of MOSFETs. The bias currents of the differential circuits are made proportional to the respective load currents.

DETAILED DESCRIPTION OF THE PREFERRED EMBODIMENTS

Figure 1:
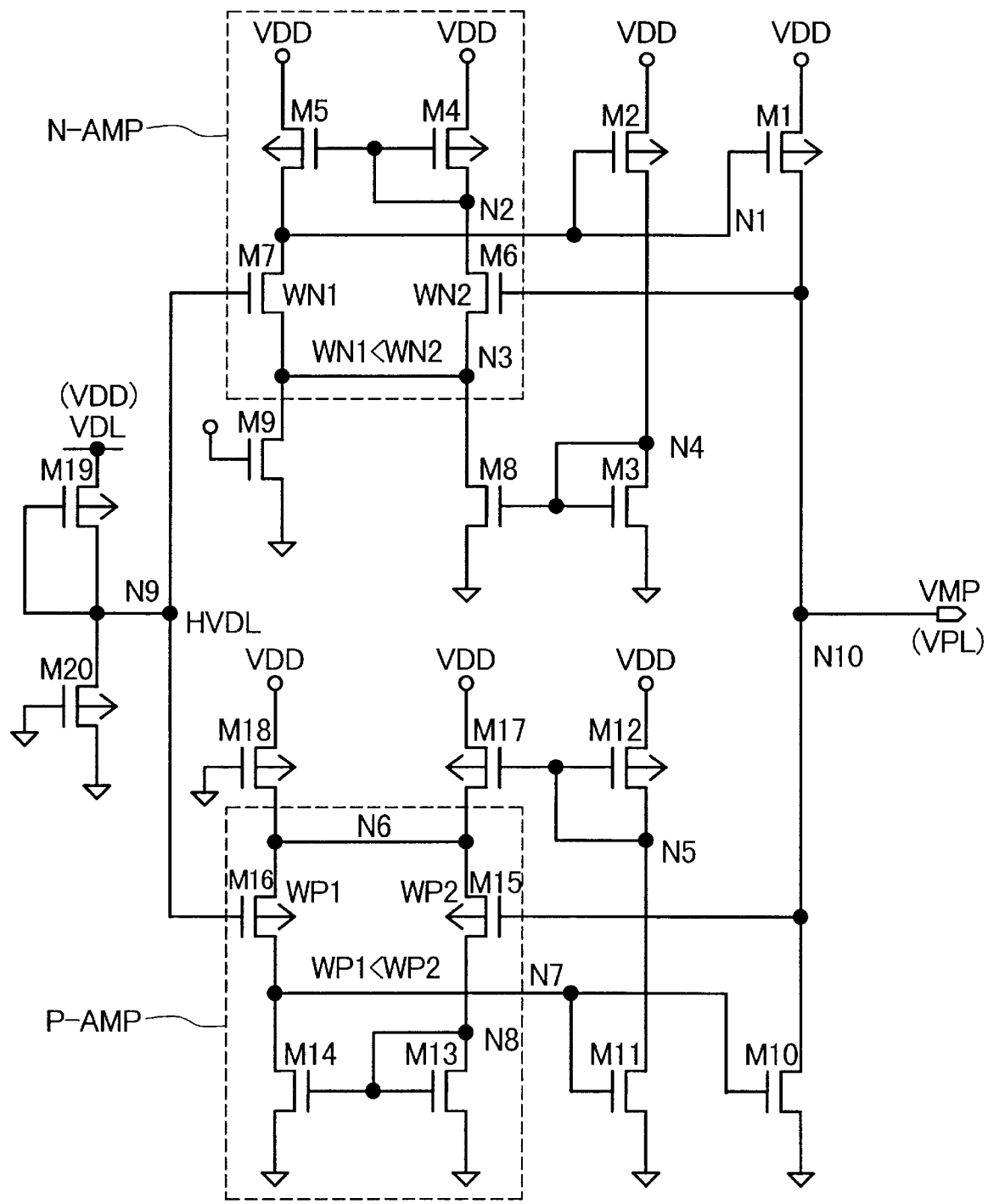
FIG. 1 is a circuit diagram illustrating a voltage generating circuit, which is a preferred embodiment of the present invention.

FIG. 1 is a circuit diagram illustrating a voltage generating circuit, which is a preferred embodiment of the present invention. In the diagram, P-channel type MOSFETs are distinguished from N-channel type MOSFETs by an arrow in the channel part of each. This voltage generating circuit can, though not necessarily should, be used as a bit line precharging voltage generating circuit for a DRAM.

This voltage generating circuit divides an internal voltage VDL (or a source voltage VDD) formed by a voltage dividing circuit consisting of direct type MOSFETs Q19 and Q20 by ½, and forms an output voltage VMP (VPL) with the resultant divided voltage HVDL as reference voltage, to which the output voltage is substantially equalized. The output voltage VMP is supplied through a complementary push-pull circuit consisting of a P-channel type output MOSFET M1 and an N-channel type output MOSFET M10.

The output MOSFETs M1 and M10 are driven by the output currents of differential circuits N-AMP and P-AMP. In this case, to prevent a large penetrating current from flowing, when the output voltage VMP becomes equal to the reference voltage HVDL, between the source voltage VDD and the ground potential of the circuit through the two output MOSFETs M1 and M10, this invention involves the following contrivance.

Offsets $\Delta V$ are set in the differential circuits N-AMP and P-AMP. In other words, when the output voltage VMP is lower than the reference voltage HVDL, an output current to set the gate voltage N1 of the output MOSFET M1 to a low level is formed by the differential circuit N-AMP, and the output MOSFET M1 is turned on to supply a current to an output node N10 and thereby to raise the output voltage VMP. Then, as an offset $\Delta V$ makes the output voltage VMP+$\Delta V$ higher than HVDL, the differential circuit N-AMP flows an output current which would raise the gate voltage N1 of the output MOSFET M1 to a high level with the result that the P-channel type output MOSFET M1 is turned off.

Conversely, when the output voltage VMP is higher than the reference voltage HVDL, the differential circuit P-AMP forms an output current which would raise the gate voltage N7 of the output MOSFET M10 to a high level with the result that the output MOSFET M10 is turned on and the output voltage VMP is lowered by absorbing the current of the output node N10. Then, as the offset $\Delta V$ makes the output voltage VMP +$\Delta V$ lower than HVDL, the differential circuit P-AMP flows an output current which would bring the gate voltage N1 of the output MOSFET M1 to a low level with the result that the N-channel type output MOSFET M10 is turned off.

As a consequence, when HVDL is equal to VMP, the presence of the aforementioned offset $\Delta V$ serves to turn off both output MOSFETs M1 and M10. Thus, the two differential circuits N-AMP and P-AMP detect any variation in the output voltage VMP and, when VMP is set equal to the reference voltage HVDL, causes the presence of the offset $\Delta V$ serve to effect such control that when one output MOSFET M1 (or M10) is off the other output MOSFET M10 (or M1) be turned off, thereby making it possible to provide an insensitive region matching the offset $\Delta V$ as illustrated in the characteristics diagram of FIG. 2.

Figure 2:
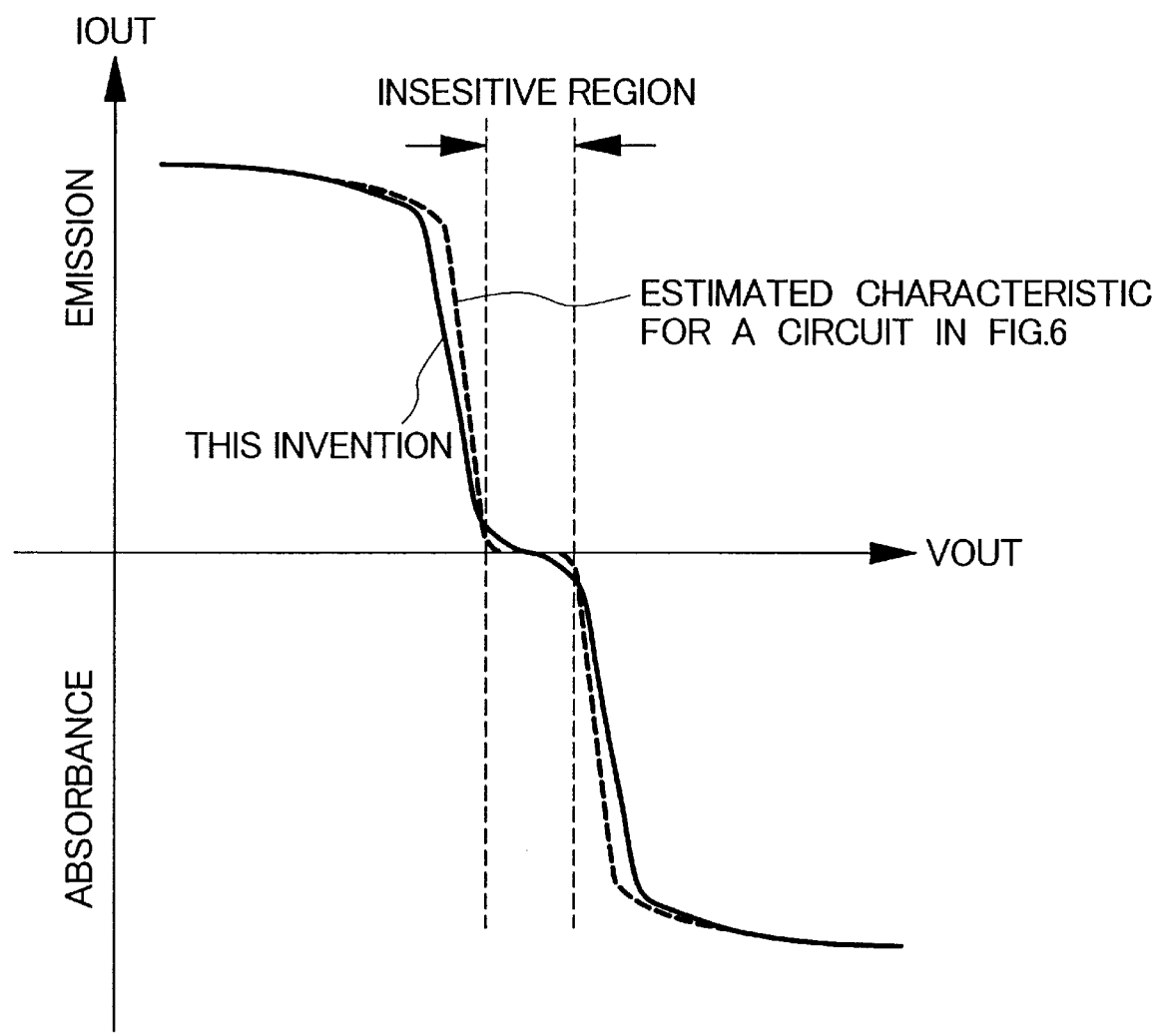
FIG. 2 is a characteristics diagram for explaining how the voltage generating circuit according to the invention and one according to the prior art operate.

More specifically, the differential circuit N-AMP sets the channel width WN1 of a differential MOSFET M7 into which the reference voltage HVDL is entered smaller than the channel width WN2 of the MOSFET M6 to which the output voltage VMP is supplied (MN1<WN2). This makes the output voltage of a voltage follower consisting of the differential circuit N-AMP and the output MOSFET M1 somewhat lower than HVDL to give the offset $\Delta V$. Similarly, the differential circuit P-AMP sets the channel width WP1 of the differential MOSFET M16 into which the reference voltage HVDL is entered smaller than the channel width WP2 of the differential MOSFET M15 to which the output voltage VMP is supplied (MP1<WP2). This makes the output voltage of a voltage follower consisting of the differential circuit P-AMP and the output MOSFET M10 somewhat higher than HVDL to give the offset $\Delta V$. In this manner, the output voltage/output amperage characteristic having an insensitive region as shown in FIG. 2 can be achieved. This insensitive region can prevent a penetrating current as can the prior art described above.

In the differential circuits N-AMP and P-AMP, the threshold voltages of the differential MOSFETs M6 and M7 are equal to each other, and so are those of the differential MOSFETs M15 and M16; the size ratio between the MOSFETs M5 and M4 and that between the MOSFETs M13 and M14, all in a current mirror scheme, are made equal to each other to set the input/output current ratio to 1:1.

In this embodiment, as stated above, a circuit to make the bias current flowing to the differential circuits N-AMP and P-AMP to be proportional to the load current. Thus, in the differential circuit N-AMP, the MOSFET M2 whose gate and source are respectively connected in common with those of the output MOSFET M1 as a current detecting circuit for monitoring the output current flowing to the output MOSFET M1, and the detection current is let flow to the common source of the differential MOSFET M6 and M7 via a current mirror circuit consisting of the N-channel type MOSFETs M3 and M8. In other words, the bias current (operating current) of the differential circuit N-AMP is formed by adding to a constant current, formed by the MOSFET M9, a current which is proportional to the load current formed by the MOSFET M8 of the current mirror circuit.

Similarly, in the differential circuit P-AMP as well, the MOSFET M11 whose gate and source are respectively connected in common with those of the output MOSFET M10 as a current detecting circuit for monitoring the output current flowing to the output MOSFET M10, and the detection current is let flow to the common source of the differential MOSFET M15 and M16 via a current mirror circuit consisting of the P-channel type MOSFETs M12 and M17. In other words, the bias current (operating current) of the differential circuit P-AMP is formed by adding to a constant current, formed by the MOSFET M18, a current which is proportional to the load current formed by the MOSFET M17 of the current mirror circuit.

By adding the circuits described above, the currents of the differential circuits are increased to make possible high speed response when, at the time of turning on the power supply or actuating a load, the load current increases to widen the difference between the output voltage VMP and the reference voltage HVDL. Furthermore, the circuit of this embodiment has an advantage over the prior art that it requires no amplifier for sensing fluctuations in output with a corresponding saving in power consumption.

While in this embodiment, in order to let the differential circuits N-AMP and P-AMP have offsets, the threshold voltages and the current mirror ratios of the differential MOSFETs are equalized and the channel widths of the differential MOSFET are differentiated, the same effect can be achieved by using different channel widths and channel lengths. Alternatively, the same effect can also be achieved by differentiating the threshold voltages of the differential MOSFETs or the current mirror ratio of the load circuit consisting of a current mirror circuit.

Since only one reference voltage is needed according to the present invention as described above, simple voltage dividing circuits, such as the MOSFETs M19 and M20 shown in the diagram can be used. Hereupon, as MOSFETs usually have high sheet resistances, this circuit can be realized in an extremely small layout area, to which the simplicity of circuitry also contributes.

As hitherto described, in a semiconductor integrated circuit containing a circuit for generating an external source voltage VDD or a voltage HVDL which is half of a voltage VDL internally generated on the basis of that external voltage, by configuring the voltage generating circuit of two sets of differential circuits for comparing a reference voltage and the output voltage, P-channel type output MOSFETs for supplying currents to loads controlled by the outputs of the differential circuits, and N-channel type output MOSFETs for absorbing currents from the loads, and providing the differential circuits with offsets, two reference voltages of different levels, which are required according to the prior art, can be dispensed with. By making the amperage of the current source added to the common source of the differential MOSFETs of the differential circuits proportional to the load current, it is made unnecessary to flow a current to any other element than an error amplifier when standing by, but the currents of the different circuits are increased only at the time of turning on the power supply or actuating a load, making it possible to reduce power consumption during standby.

Figure 3:
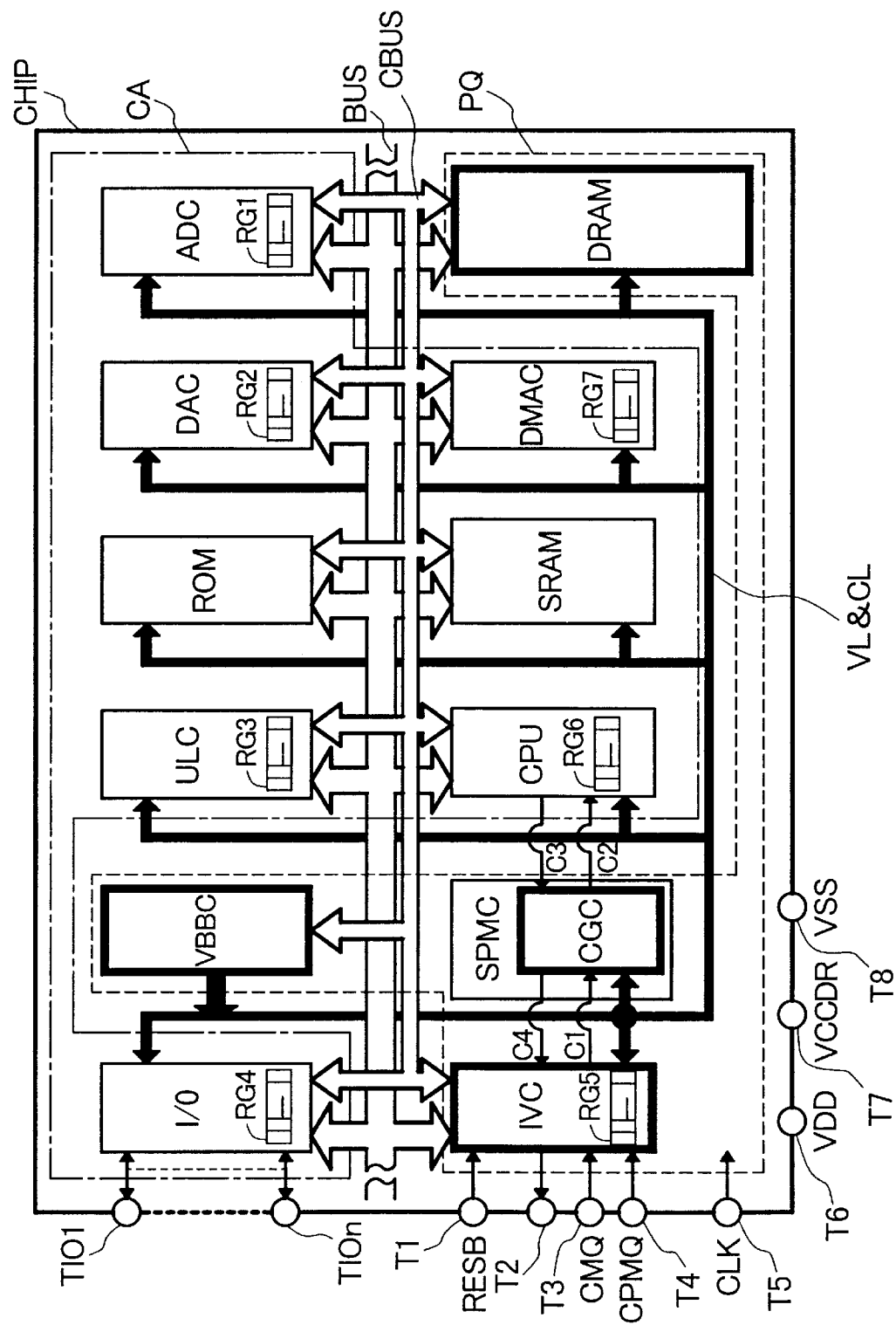
FIG. 3 is an overall circuit diagram of one embodiment of a system LSI to which the invention is applicable.

FIG. 3 is an overall circuit diagram of one embodiment of a system LSI to which the invention is applicable. The semiconductor integrated circuit device CHIP, which embodies the invention, comprises a plurality of circuit blocks as illustrated, i.e. an input-output circuit I/O, a substrate bias control circuit VBBC, a control circuit ULC, a read only memory ROM, a D/A converter DAC, an A/D converter ADC, an interruption control circuit IVC, a system power management circuit SPMC having a clock generating circuit CGC, a central processor unit CPU, a static memory SRAM, a DMA controller DMAC, and a dynamic random access memory DRAM.

These circuit blocks are connected to an internal bus BUS and a control bus CBUS. They are mounted on a semiconductor substrate which is to constitute a semiconductor integrated circuit device. The system power management circuit SPMC has a function to control power consumed by each of the modules mounted on the system LSI.

The semiconductor integrated circuit device has input-output external terminals (TIOs) TIO1 through TIOn connected to the input-output circuit I/O, an external terminal T1 to which a reset signal RESB such as a negative logical level is supplied, a control external terminal T2, a first operation control external terminal T3 to which a first operation control external signal CMQ is supplied, a second operation control external terminal T4 to which a second operation control signal CPMQ is supplied, a clock external terminal T5 to which an external clock signal is supplied, and a plurality of power supply external terminals T6, T7 and T8 to which a plurality of source voltages VDD, VCCDR and VSS are supplied.

The source voltage VDD, supposed to be the source voltage for the operation of the internal circuit blocks, may be, though not necessarily should be, 1.8 V±0.15 v. The source voltage VCCDR is a source voltage set mainly for the input-output circuit I/O according to the input-output level required for the semiconductor integrated circuit device, and may be 3.3 V±0.3 V, 2.5 V±0.25 V or 1.8 V ±0.15 V. The potential VSS is the reference potential for the circuit, which is commonly known as a ground potential.

The illustrated semiconductor integrated circuit device is designed to constitute so-called application specified integrated circuits (ASIC), i.e. ICs for specified uses. Thus, almost every one of the illustrated circuit blocks is composed to be a module or a macro-cell as an independent unit of circuit functioning to facilitate ASIC configuration. Each functional unit is variable in scale and configuration. For the ASIC configuration, out of the illustrated circuit blocks, those not required by the electronic system to be realized may be excluded from mounting on the semiconductor substrate. Conversely, any functional unit of circuit block not illustrated here can be added as required.

The semiconductor integrated circuit device is structured as a CMOS compatible with a low voltage so as to be able to manifest adequate operational characteristics even at a low source voltage VDD including, but not limited to, 1.8 V±0.15 V.

The dynamic memory to be mounted on the semiconductor integrated circuit device may be operated by the above-mentioned source voltage (VDD). However, for the dynamic memory of this semiconductor integrated circuit device, not only the source voltage VDD but also a high source voltage generated by the voltage generating circuit operated by the source voltage VDD is used. In the dynamic memory, circuits, such as a row decoder for selecting a dynamic memory cell, are driven by this high source voltage, while circuits for inputting or outputting signals to or from the internal bus BUS of the semiconductor integrated circuit device are operated by a source voltage such as the low source voltage VDD. This configuration serves to increase the electric charge as information provided to the dynamic memory cell. This contributes to improving the information holding time characteristic of the dynamic memory. Similarly, high speed reading is made possible by causing the sense amplifier to be driven by an overdrive system using a boosted voltage such as mentioned above.

The central processing unit CPU may, though not necessarily should, have a configuration similar to that of a microprocessor. Thus, the central processing unit CPU, while not illustrated in detail, comprises within it a command register, a micro command ROM for decoding instructions written into the command register and forming various micro commands or control signals, an arithmetic unit, general registers (RG6, etc.), and input-output circuit including a bus driver to be coupled to the internal bus BUS and a bus receiver.

The central processing unit CPU reads out commands stored in the read only memory ROM and elsewhere, and performs actions matching the respective commands. The central processing unit CPU takes in external data entered via the input-output circuit I/O, inputs and outputs data to and from the control circuit ULC, reads commands from the read only memory ROM and data such as fixed data needed for the execution of the commands, supplies the D/A converter DAC with data to be subjected to D/A conversion, reads data subjected to A/D conversion by the A/D converter, reads and writes out of and into the static memory SRAM and the dynamic memory DRAM, and controls the operation of the DMA controller DMAC. The control bus CBUS is used for operation control of the illustrated circuit blocks by the central processing unit CPU as well as for conveying state indicating signals to the central processing unit CPU from circuit blocks including the DMA controller DMAC.

The central processing unit CPU also references operation control signals set in the designation register RG5 and the like in the interruption control circuit IVC via the internal bus BUS, and performs required processing. The central processing unit CPU receives a system clock signal generated by the clock generating circuit CGC, and is operated at the operational timing and in the period determined by the system clock signal C2.

The central processing unit CPU, when the supply of the system clock signal C2 from the clock generating circuit CGC is discontinued, is suspended from operation accordingly. In the suspended state, the output signals of dynamic circuits are undesirably varied by undesired leak currents generating in the circuits. Circuits such as register circuits of a static flip flop circuit configuration holds previous data even while no system clock signal is being supplied.

The interruption control circuit IVC receives a reset signal such as a negative logic level via the external terminal T1, a first operation control signal CMQ via the external terminal T3 and a second operation control signal via the external terminal T4, and supplies via the external terminal T2 a state indicating signal indicating the operating state of the semiconductor integrated circuit device. The interruption control circuit IVC has the register RG5 which can set bits in positions respectively corresponding to the reset signal RESB, the operation control signals CMQ and CPMQ and the state indicating signal.

The state indicating signal in the register RG5 is updated by the central processing unit CPU via the internal bus BUS. The operation control signals CMQ and CPMQ set into the register RG5 via the external terminals T3 and T4 are, as stated above, referenced by the central processing unit CPU via the internal bus BUS.

The interruption control circuit IVC may, though necessarily should, have a refresh address counter (not shown) for refreshing operation of the dynamic memory. This refresh address counter in the interruption control circuit IVC, if the first and third modes are designated by the first and second operation control signals CMQ and CPMQ, i.e. if either the operation mode of the operation standby mode is designated for the semiconductor integrated circuit device, is incremented in accordance with a system clock signal from the clock generating circuit CGC, and forms refresh address information which is periodically updated.

The clock generating circuit CGC receives an external clock signal CLK via the external terminal T5, and forms a system clock signal C2 on the basis of the external clock signal CLK. Incidentally, while in FIG. 3 signal lines between the clock generating circuit CGC and the central processing unit CPU are depicted in a simplified manner, it is to be understood that the system clock signal C2, like a clock signal for a usual processor, consists of a multiple phase signal for orderly operation of a circuit (not shown) in the central processing unit CPU.

The generation of the system clock signal C2 by the clock generating circuit CGC is controlled with a mode signal MODE2 responding to the first and second operation control signals CMQ and CPMQ from the interruption control circuit IVC, a control signal C1 such as an initial operation indicating signal INTL, and a control signal C3 from the central processing unit CPU. If the operation control signal CMQ instructs a full standby, necessary processing steps for a shift to the full standby, including the writing of data to be statically held into the static memory SRAM, are accomplished by the central processing unit CPU, followed by the generation of a control signal C3 to suspend system clock generation from the central processing unit CPU to the clock generating circuit CGC.

If the operation control signal CPMQ instructs an operation standby, as in the case of the full standby described above, necessary processing steps for a shift to the operation standby, including the writing of data to be statically held into the static memory SRAM, are accomplished by the central processing unit CPU. What follows in this case is, unlike the operation following the full standby described above, the generation of a control signal C3 for selective outputting of the system clock signal from the central processing unit CPU to the clock generating circuit CGC.

The input-output circuit I/O receives a signal externally supplied via a desired one out of the external terminals TIO1 through TIOn, and also receives via the internal bus BUS a signal to be supplied to a desired one out of the external terminals TIO1 through TIOn. The input-output circuit I/O has within it a control register RG4 and a data register (not shown) each consisting of a CMOS static circuit.

The control register RG4 is selected by the central processing unit CPU, and is provided by the central processing unit CPU control data for the input-output circuit I/O, for instance control data for data input/output indication or high output impedance state indication. The data register is used for transferring data between the external terminals TIO1 through TIOn and the internal bus BUS. The data register is disposed to have, if the bit width of the external terminals TIO1 through TIOn, i.e. their number, differs from that of the internal bus BUS, such a number of bits as match the greater bit width, and converts the number of bits under operation control by the central processing unit CPU.

A circuit for inputting signals to the input-output circuit I/O and one for outputting signals therefrom undergo control of their respective inputting and outputting operations with the system clock signal. Therefore, when the system clock signal ceases to be supplied, the input-output circuit I/O, like the central processing unit CPU as stated above is placed in a state of low power consumption.

The control circuit ULC is a control circuit provided as the relevant electronic system requires. As this control circuit ULC is provided appropriately for the electronic system to be realized to perform motor servo control, head tracking control or error correction in a hard disk drive, or compression or extension of video or audio data in video or audio processing. The operation of the control circuit ULC is controlled, as is that of the central processing unit CPU, with the system clock signal.

The read only memory ROM, as stated above, stores instructions to be read out and executed by the central processing unit CPU and fixed data.

The D/A converter DAC has a register RG2 for receiving digital data supplied via the internal bus BUS and to be converted into analog signals, and forms analog signals on the basis of these digital data. In the register RG2 are set digital data by the control circuit ULC or the central processing unit CPU. Such aspects of D/A converting actions by the D/A converter DAC as the timing of D/A conversion start and that of supplying the result of D/A conversion are controlled with the system clock signal. Analog signals formed by the D/A converter DAC may be, though not necessarily should, supplied to a desired one out of the external terminals T1 through Tn via the internal bus BUS and the input-output circuit I/O. Incidentally, although the external terminals T1 through Tn here are supposed to be combined input-output terminals (pins), dedicated input terminals and output terminals may as well be provided separately.

The D/A converter DAC, though its details are not illustrated, is provided with either a reference voltage source or a reference amperage source to serve as the reference for the quantity of analog signals to be obtained where precise D/A conversion is required. Such a reference voltage source or a reference amperage source is deemed to constitute a sort of analog circuit, which involves the risk of consuming too great an amperage to ignore in the second and third modes, i.e. in the full standby and the operation standby modes. Therefore, in order to enable the power consumption in such modes to be reduced, the reference voltage source or the reference amperage source is provided with a MOSFET switch to switch the source off when in the second or third mode.

The A/D converter ADC receives analog signals supplied via a desired one out of the external terminals T1 through Tn, the input-output circuit I/O and the internal bus BUS. The start of their A/D conversion is controlled by either the control circuit ULC or the central processing unit CPU, the analog signals are converted into digital signals under clock control in accordance with the system clock signal C2, and the obtained digital signals are set into a register RG1.

The A/D converter ADC, too, like the D/A converter DAC described above, is provided with either a reference voltage source or a reference amperage source to serve as the reference for the quantization level of required digitization where precise A/D conversion is called for. Such a reference voltage source or a reference amperage source involves the risk of consuming too great an amperage to ignore in the full standby and the operation standby modes. Therefore, in such modes, the reference voltage source or the reference amperage source is provided with a MOSFET switch similar to the aforementioned.

The static memory SRAM has a CMOS static memory cell having a configuration consisting, though details are not illustrated, of a CMOS latch circuit and a pair of transmission gate MOSFETs for inputting and outputting data to and from the latch circuit. The CMOS static memory cell has a characteristic that it can hold information statically and consumes only an extremely small operation current for holding information.

Such a static memory SRM is disposed to constitute substantially a CMOS static random access memory. Thus the static memory SRAM comprises a memory array consisting of a plurality of CMOS static memory cells arranged in a matrix; a row address decoder and driver for decoding a row address signal supplied via the internal bus BUS and selecting a word line in the memory array on that basis; a column address decoder for decoding a column address signal and thereby forming a column decoded signal; a column switching circuit, actuated by the column decoded signal, for selecting a word line in the memory array and connecting it to a common data line; an input-output circuit connected to the common data line; and a read-write control circuit.

Circuits like such an address decoder and driver related to the memory array, i.e. circuits peripheral to the memory array, consist of CMOS static circuits. Therefore, the static memory cell SRAM is placed in a state of relatively low power consumption when it is only holding information involving neither reading nor writing. Incidentally, a CMOS static memory tends to have a relatively large memory cell size, a large overall size relative to the storage capacity, which is a characteristic deserving serious consideration and making it relatively difficult to achieve a large storage capacity.

The operation of the DMA controller, i.e. the direct memory access controller DMAC, is controlled by the central processing unit CPU, controls on behalf of the central processing unit CPU data transfers between circuit blocks via the internal bus BUS instructed by the central processing unit CPU. While no further details of the DMA controller DMAC are described here because its configuration can be substantially similar to a DMA controller configured as an independent semiconductor integrated circuit, it controls data transfers on the basis of information set a register RG7 or the like within it by the central processing unit CPU, including transfer origin information, transfer destination information and transferred data quantity information.

In a dynamic memory DRAM, its memory cell, i.e. the dynamic memory cell typically consists of a relatively small number of elements including information storing capacitors for accumulating information in an electric charge form and MOSFETs for selection, and can be formed in a relatively small memory cell size. Therefore, the overall size of a dynamic memory can be relatively small even if its storage capacity is large. This dynamic memory DRAM will be described next.

Figure 4:
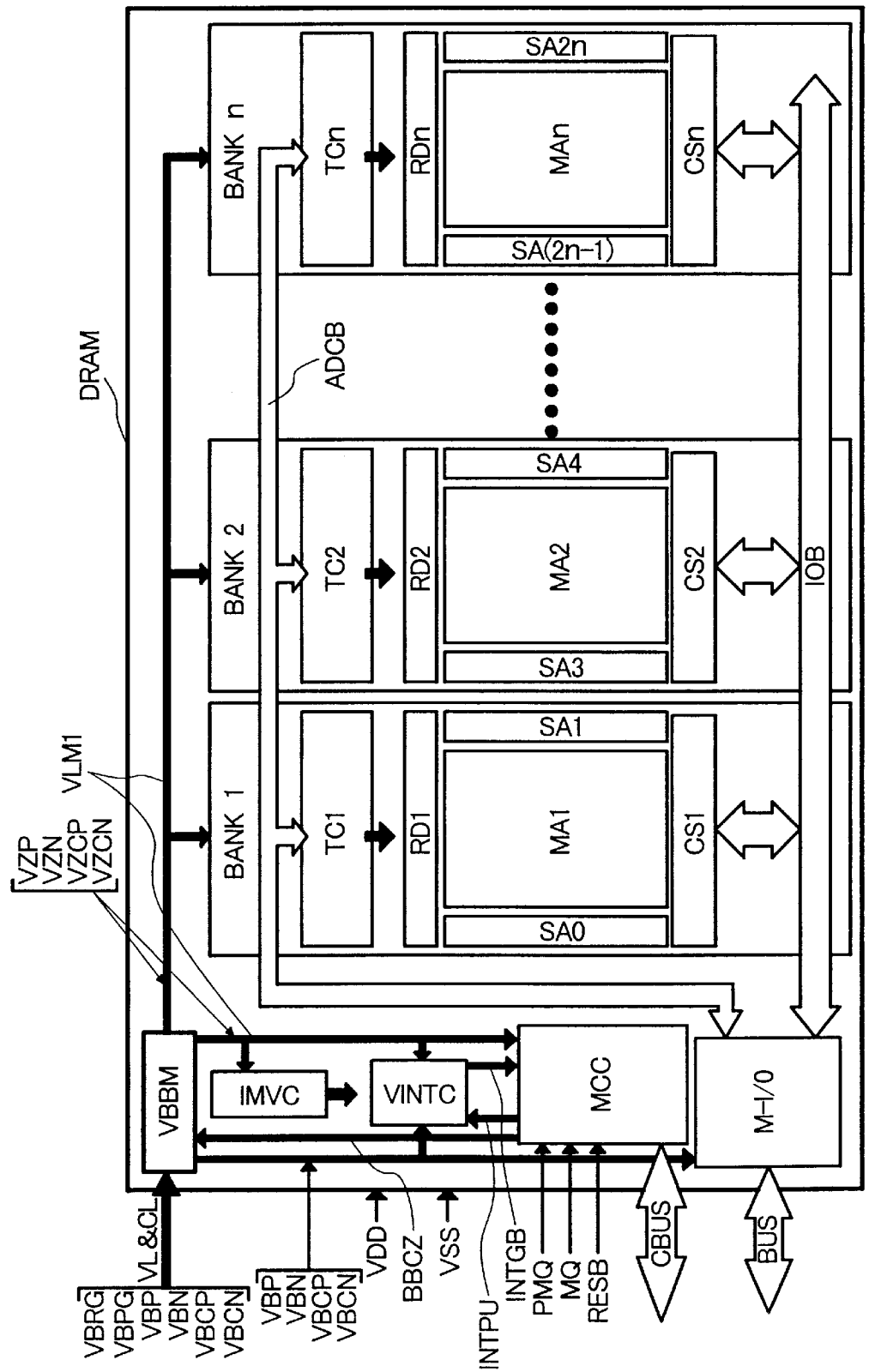
FIG. 4 is a block diagram of one embodiment of a DRAM to be mounted on a semiconductor integrated circuit device to which the invention is applicable.

FIG. 4 is a block diagram of one embodiment of a dynamic memory (DRAM) to be mounted on a semiconductor integrated circuit device to which the invention is applicable. This DRAM constitutes a module or a functional unit in, for instance, the aforementioned system LSI (semiconductor integrated circuit).

The illustrated DRAM may, though not necessarily should, have a bank configuration to be suitable for a large storage capacity. The number of memory banks is variable with an upper limit of 16. One memory bank, e.g. the first memory bank BANK1, consists of a memory cell array MA1, sense amplifiers SA0 and SA1, a bit line precharging circuit (not shown) integrated with the sense amplifiers, a timing generating circuit, a column selector TC, a row decoder RD and a column switching circuit CS1.

An address bus/control bus ADCB for address signals and control signals is set to match the plurality of memory banks, and so is a memory internal bus (I/O internal bus) IOB for data inputting and outputting. A common memory input-output circuit M-I/O is provided for these buses ADCB and IOB. The memory input-output circuit M-I/O has within it a port to be connected to the internal bus BUS.

The DRAM further has a substrate bias switching circuit VBBM connected to a substrate bias control circuit VBBC via wiring groups VL and CL, an internal power source circuit IMVC, a memory control circuit MMC receiving internal operation control signals MQ and PMQ, a reset signal RESB and various operation control signals via the control bus CBUS, and a power source initializing circuit VINTC. The internal power source circuit IMVC contains charge pump circuits such as the aforementioned boosting circuit and negative voltage generating circuit.

In the above-described configuration, a set of elements of a broader range may as well be regarded as consisting of fewer elements according to the convenience of the unit of management of design data in design automation for configuring the semiconductor integrated circuit. For example, the memory cell array (MA1), the sense amplifiers (SA1 and SA2), the row decoder (RD1), and the column switch (CS1) in one memory bank may be regarded as constituting one memory mat, and the timing generator/column selector (TC1), as making up a bank control circuit. In this case, each memory bank is deemed to be consisting more simply of a memory mat and a bank control circuit.

In the illustrated DRAM, the aforementioned memory mat and a selector therefor are made substantially the same as their respective counters in any known DRAM, which is configured as an independent CMOS type semiconductor integrated circuit. Therefore its internal configuration is not described in detail here, and it will be only outlined below.

A memory cell array such as the memory cell array MA1 comprises a plurality of dynamic memory cells arranged in a matrix, a plurality of word lines to which selection terminals for the respectively corresponding memory cells are connected, and a plurality of bit lines to which data input/output terminals for the respectively corresponding memory cells are connected.

A selective MOSFET constituting each memory cell has a structure in which, in a P-type well region PWELL1 formed over a semiconductor substrate consisting of P-type monocrystalline silicon, its N-type source region and N-type drain region are formed. It may be, though not necessarily should be, electrically separated from an N-type separatory semiconductor region doped in a relatively low concentration. This separatory region is kept at a positive potential like the power supply terminal VDD of the circuit. The N-type separatory semiconductor region serves to protect the P-type well region PWELL1 from any undesirable carrier that may be caused to arise in the P-type semiconductor substrate by α particles or the like.

The P-type well region PWELL1 in which the memory cell is formed is given a substrate bias voltage VBB of a negative potential formed by the internal power source circuit IMVC within the DRAM. This serves to reduce the tailing current or the leak current of the selective MOSFET in the memory cell and accordingly the information from the information storage capacitance of the memory cell.

Over the P-type well region PWELL1 is formed the information storage capacitance of the memory cell with an insulating film of silicon oxide in-between. One of the electrodes of the information storage capacitance is electrically connected to an electrode region which can be regarded as the source region of the selective MOSFET. The other electrode of each of a plurality of information storage capacitances for a plurality of memory cells is made a common electrode, usually known as a plate electrode. The plate electrode is provided with a prescribed potential VPL as a capacitance electrode.

The information storage capacitance should desirably be relatively small so that the size of the memory cell array can be reduced, and at the same time is called upon to have a large capacity so that it can hold information for a long period of time. In order to provide the information storage capacitance with a large capacity, the material of the dielectric film sandwiched between its electrodes is chosen out of substances greater in dielectric constant, such as tantalum oxide or silicon oxide for instance, and the film thickness is minimized to increase the capacity per unit area. The plate electrode potential VPL for a plurality of information storage capacitance is set to be an intermediate potential equal to half of the source voltage VDD of a circuit formed by a voltage conversion circuit IMVC. In such a voltage conversion circuit IMVC, a voltage generating circuit such as that in the above-described embodiment of FIG. 1 is adopted.

This reduces the plate electrode potential VPL to about half of the source voltage VDD whether one of the electrodes of the information storage capacitance is supplied with a high level, such as the source voltage VDD level, or a low level, such as one equal to the ground potential of the circuit, according to the information to be stored. Thus, the voltage applied to the dielectric film is limited to a low level, such as about half of the source voltage VDD. This enables the voltage resistance of the dielectric film to be lowered and also the undesired leak current to be reduced along with the lowering of the voltage applied, so that the film can be thinned to a marginal thickness.

A timing generator/column selector, such as the timing generator/column selector TC1, undergoes operation control with an operation control signal from a global control circuit in a memory control circuit MCC, is activated or selected by a bank selection signal supplied via the bus ADCB, forms various internal timing signals for the operation control of various circuits including a bit line precharging circuit for bit lines of the memory cell array, the row decoder, the sense amplifiers, and the column selector within itself. The column selector in the timing generator/column selector undergoes operation control with an internal timing signal, decodes a column address signal supplied via the bus ADCB, and forms a decoded signal for actuating a column switching circuit, such as the column switching circuit CS1, in the pertinent bank.

A row decoder, such as the row decoder RD1, undergoes operation control with a timing signal supplied from the timing generator/column selector, decodes an address signal supplied via the bus ADCB, and selects a matching word line in the memory cell array.

The bit line precharging circuit is actuated by a precharge timing signal at a proper timing, such as before the activation of the row decoder, and precharges each bit line in the corresponding memory cell array to a level equal to about half of the source voltage. For supplying the precharge voltage to this bit line precharging circuit, such a voltage generating circuit as that in the above-described embodiment of FIG. 1 is adopted.

Sense amplifiers such as the sense amplifier SA0 and SA1 are actuated after the activation of the row decoder with a sense amplifier timing signal generated by a timing generator/column selector such as TC1, and amplify signals provided to bit lines by memory cells selected by the row decoder, i.e. read signals. Each of a plurality of unit sense amplifiers in the sense amplifiers, each matching one or another bit line, has substantially the same configuration as a sense amplifier of the well known CMOS configuration.

Each of the unit sense amplifiers has a pair of P-MOSs whose gates and drains are cross-connected and a pair of N-MOSs whose gates and drains are similarly cross-connected. The drains of the pair of P-MOSs and those of the pair of N-MOSs are connected to the matching pair of bit lines. The sources of the pair of P-MOSs are commonly connected, and given an operating potential via a switch MOSFET whose operation is controlled with a sense amplifier timing signal. Similarly the sources of the pair of N-MOSs are commonly connected, and given an operating potential, such as the ground potential of the circuit, via the switch MOSFET whose operation is controlled with the sense amplifier timing signal.

As these operating voltages, a voltage matching a high level of bit lines, such as the source voltage VDD, and a higher voltage than that, i.e. the boosted voltage VBS. There is used the so-called overdrive system, wherein the boosted voltage VBS causes the sense amplifiers to perform amplification for a certain period from the time the sense amplifiers begin amplification and the potentials of bit lines, which should be raised to a high level, reach a desired voltage. When the potentials of the bit lines come close to the desired level VDD, the operating voltages of the sense amplifiers are switched to the source voltage VDD matching the usual high level of the bit lines.

The arrangement of the two sense amplifiers with the memory cell array in-between implies the following configuration. Thus, to the sense amplifier on one side of the memory cell array every other one of the plurality of bit lines of the memory cell array is connected, and to the sense amplifier on the other side of the memory cell array are connected the rest of the plurality of bit lines of the memory cell array. This configuration effectively serves to achieve a fine pitch in the arrangement of a plurality of bit lines in memory cell array where it is inevitable to dispose a plurality of MOSFETs constituting a sense amplifier in a relatively large pitch according to the required size.

A column switching circuit, such as the column switching circuit CS1, is actuated by a selection signal supplied from the matching column selector. A column switching circuit selects a bit line designated by a column selector out of a plurality of bit lines in the memory cell array, and connects it to the memory internal bus IOB.

A memory input-output circuit M-IO is connected to the internal bus BUS of the semiconductor integrated circuit, receives address signals and control signals from the internal bus BUS, and transmits them to the internal bus ADCB. The memory input-output circuit M-IO also performs inputting-outputting of memory data between the bus BUS and the memory internal bus IOB.

The memory control circuit MCC receives the first and second operation control signals MQ and PMQ and the reset signal RESB within the semiconductor integrated circuit device, and carries out control operations according to these signals. The memory control circuit MCC may, though not necessarily should, have a first control logic circuit MSW which receives the first operation control signal MQ and the second operation control signal PMQ and forms an internal operation control signal BBCZ according to them, and a second control logic circuit VINT which receives the first operation control signal MQ and the reset signal RESB and forms a substantial initialization control signal INTGB according to it.

The substrate bias switching circuit VBBM receives from the substrate bias control circuit VBBC various bias voltages VBP, VBN, VBPG and VBNG and control signals VBCP and VBCN via the wiring groups VL and CL, also receives a control signal BBCZ from the memory control circuit MCC, and supplies signal bias voltages to circuits in the DRAM where they are needed under operation control with those bias voltages and the control signal.

The voltage conversion circuit IMVC receives a source voltage supplied between the power source terminal VDD of the DRAM and the reference potential terminal VSS, and forms internal voltages including the aforementioned substrate bias voltage VBB for the memory cell array, the plate voltage VPL, a boosted voltage VDH for setting the word line selection level, and a boosted voltage VBS for overdriving the sense amplifiers. The substrate bias voltage VBB for the memory cell array may be, though not necessarily should be, formed in a pertinent circuit IMVC within the DRAM as a module. A circuit to form the bias voltage VBB and the boosted voltage VDH of negative potential levels is contrived to be able to form desired low voltages even at a low source voltage as stated above.

A configuration, such as that of this configuration, wherein the bias voltage VBB is independently formed has the advantage that, whereas information signals read out of dynamic memory cells are at a very low level, variations in the potential of the P-type well region PWELL can be effectively restrained without disturbing that very low level. Such a circuit to form the bias voltage VBB is enabled to make its own power consumption sufficiently small, because the undesired leak current flowing from the memory cell array to that P-type well region PWELL is generally small and the output capacity of the circuit need not be so large.

The power source initializing circuit VINTC initializes the DRAM circuit under operation control by the memory control circuit MCC. A typical configuration of the power source initializing circuit VINTC and particulars of its initializing operation will not be described in detail because they are not directly relevant to the invention under the present application.

In the foregoing description, the term "MOS" is understood to have been originally an abbreviation of a "metal oxide semiconductor" configuration. However, in its recent usage, the term also covers semiconductor devices in whose essential part metal is replaced with a non-metallic electrical conductor, such as polysilicon, or oxide is replaced with some other insulator. The term "CMOS" has also come to be understood to have a broader technical meaning corresponding to the above-noted change in the sense of MOS. Nor is "MOSFET" understood in a narrow sense as in the past, but its meaning now covers what is substantially an insulated gate field effect transistor. The terms "CMOS" and "MOSFET" in the context of the invention are used in their respective usual senses.

Figure 5:
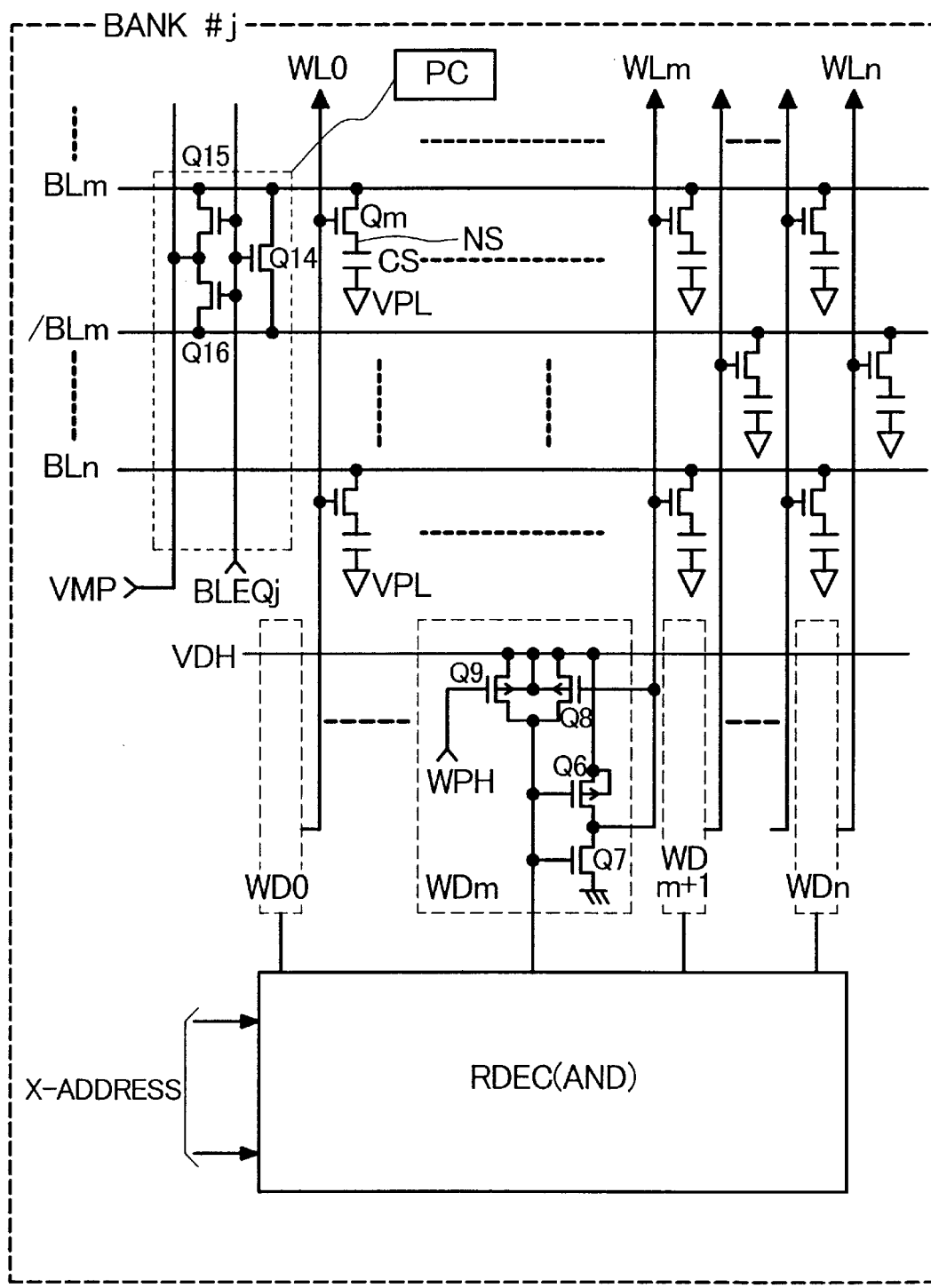
FIG. 5 is a circuit diagram illustrating one embodiment of the memory cell array section of the DRAM shown in FIG. 4.
Figure 6:
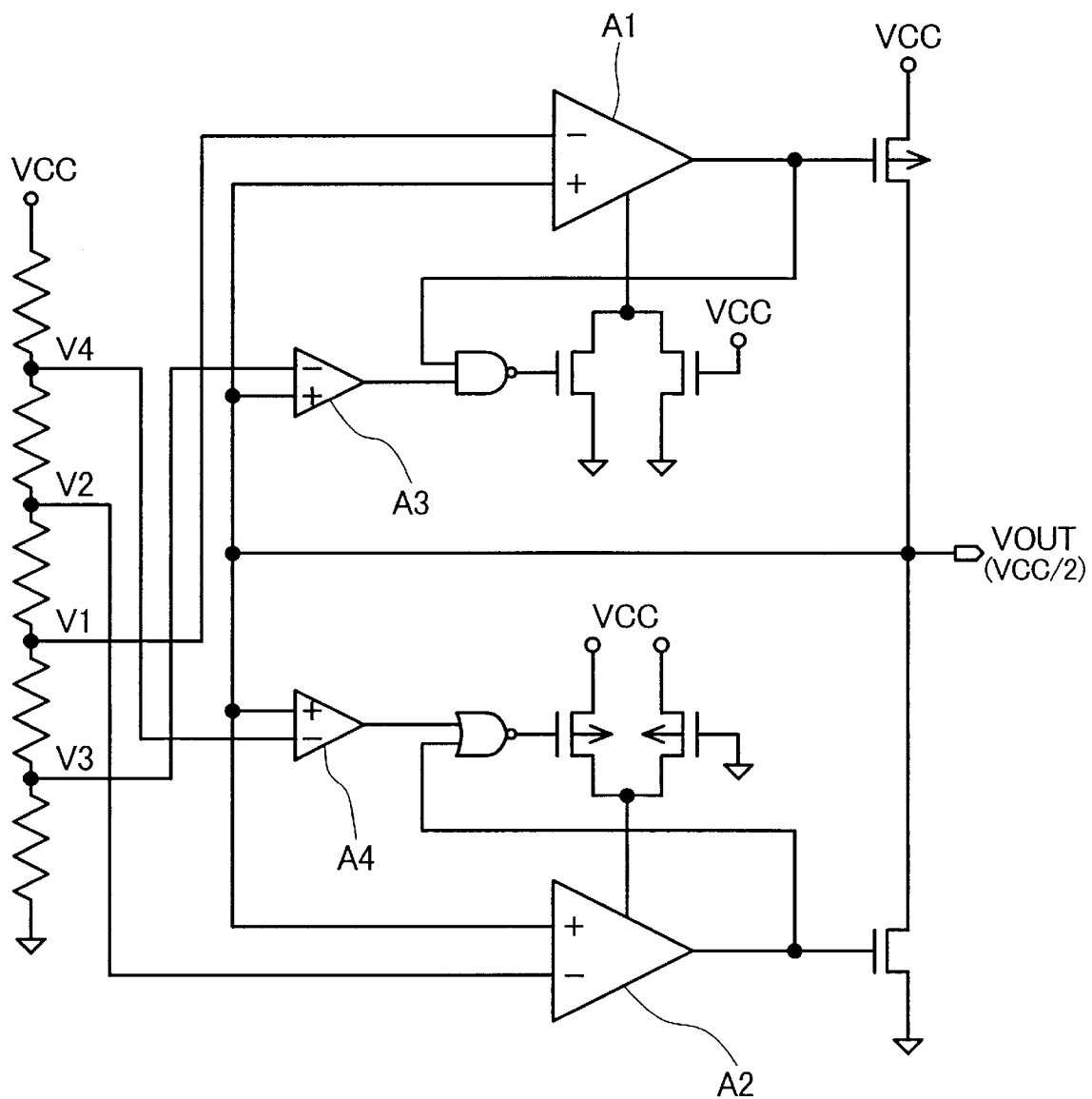
FIG. 6 is a circuit diagram illustrating one example of bit line precharging voltage generating circuit according to the prior art.

FIG. 5 is a circuit diagram illustrating one embodiment of the memory cell array and the word line selecting circuit. In the figure, a bit line equalizing and precharging circuit contained in the memory array section is also shown. In the illustration of the memory mat here, the bank addresses #0 through #n are represented by one bank #j as an example. A plurality of complementary bit lines and a plurality of word lines provided on the bank (memory mat) #j are respectively represented by a pair of complementary bit lines BLm and /BLm and one bit line BLn, and word lines W10, WLm, WLm+1 and WLn as examples.

To describe the configuration with respect to a memory cell positioned at the point of intersection between the word line W10 and the bit line BLm, the gate of an address selecting MOSFET Qm is connected to the word line. The source and drain on one side of the MOSFET Qm are connected to the bit line BLm. The source and drain on the other side of the MOSFET Qm are connected to a storage node NS, which is one of the electrodes of a storage capacitor CS, while the other electrode of the storage capacitor CS is shared with the counterpart electrode of the storage capacitor of another memory cell, and a plate voltage VPL is applied to it. This plate voltage VPL is formed by a voltage generating circuit such as that illustrated in FIG. 1.

The memory cells are arranged in a matrix, each at the intersection point of a word line and a complementary bit line. For instance, for the word line WLm and the adjoining word line WLm+1, a memory cell is provided at the intersection point of the word line WLm and the bit line BLm, one of two complementary bit lines, and another memory cell is provided at the intersection point of the word line WLm+1 and the other bit line /BLm of the two complementary bit lines. Instead of arranging in this manner one memory cell on each odd-numbered word line and one of complementary bit line and another on each even-numbered word line and the other complementary bit line, every two word lines may as well be paired and two memory cells provided for each such pair of word lines alternately connected to one and the other of complementary bit lines.

The complementary bit lines BLm and /BLm are provided with N-channel type MOSFETs Q14 through Q16 constituting an equalizing and precharging circuit. The MOSFET Q14 is set to a half potential by short-circuiting the high level and the low level (or the low level and the high level) of the complementary bit lines BLm and /BLm. The MOSFETs Q15 and Q16 are intended to prevent the half potential created by the short circuiting of the complementary bit lines BLm and /BLm from being varied by a leak current or the like, and supplies a half precharge voltage VMP to the complementary bit lines BLm and /BLm. The gates of these MOSFETs Q14 through Q16 are commonly connected to supply a precharging and equalizing signal BLEQj. Thus, after a word line is reset from the selection level to the non-selection level, the signal BLEQj varies to a high level to turn the MOSFETs Q14 through Q16 on and to subject the complementary bit lines BLm and /BLm to precharging and equalization. For the half precharge voltage VMP is used the aforementioned voltage generating circuit which is illustrated in FIG. 1.

Corresponding to the plurality of word lines W10 through WLn, there are provided a plurality of word line driving circuits WD0 through WDn, of which the specific circuitry of the word line driving circuit WDm corresponding to the word line WLm is illustrated in FIG. 5 as a typical example. As the word line driving circuit WDm is used a CMOS inverter circuit composed of a P-channel type MOSFET Q6 whose source is connected to the boosted voltage power source VDH consisting of the aforementioned boosting circuit and an N-channel type MOSFET whose source is connected to the ground potential of the circuit. The drains of the MOSFETs Q6 and Q7 are commonly connected to constitute an output terminal, and connected to the word line WLm. The gates of the MOSFETs Q6 and Q7 are commonly connected to constitute an input terminal, to which a selection signal formed by a row (X) decoder RDEC is supplied.

Between the input terminal of the CMOS inverter circuit (Q6 and Q7) and the aforementioned boosted voltage power source VDH, there are provided in parallel a precharging P-channel type MOSFET Q9 whose source-drain route is connected and a P-channel type MOSFET Q8 for non-selective latching. The gate of the P-channel type MOSFET Q8 for non-selective latching is connected to the aforementioned output terminal of the CMOS inverter circuit (Q6 and Q7). To the gate of the precharging P-channel type MOSFET Q9 is supplied a precharging signal WPH. A signal generating circuit for forming this precharging signal WPH forms as operating voltages for the aforementioned boosted voltage power source VDH signals WPH of a high level matching the word line selection level and a low level, such as the ground potential of the circuit.

The MOSFET Q14 is a MOSFET for level limiting. When a sense amplifier (not shown) is to operate at the source voltage VDD, the high level of the potential of the complementary bit line BLm or /BLm matches the source voltage VDD, and the potential of the aforementioned boosted voltage VDH is formed to be the source voltage VDD+VDH. Here, VTH is the threshold voltage of the address selective MOSFET Qm, and signals of a high level, such as the source voltage VDD of the complementary bit line BLm or /BLm amplified by the amplifying operation of the sense amplifier, are enabled to be conveyed to a capacitor Cs without level loss.

The advantages provided by the above-described embodiments are as follows.

(1) First and second output MOSFETs respectively of first and second electrical conduction types, of which the gates are supplied with the output voltage of first and second differential circuits, whose respective first input terminals are supplied with a prescribed reference voltage, the sources are respectively supplied with a first voltage higher than the reference voltage and a second voltage lower than the reference voltage, and the drains are connected to the output terminal, form an output voltage matching the reference voltage; the first and output MOSFETs are prevented from being turned on simultaneously by an offset between the first and second differential circuits; and accordingly two reference voltages of different levels need not be used, resulting in circuit simplification and a saving in power consumption.

(2) The above-mentioned first and second voltages being the source voltage and the ground potential of the circuit, respectively, ½ of the source voltage is used as the prescribed reference voltage, with the result that an internal voltage set to ½ of the source voltage can be formed with a simple configuration and moreover without consuming much power.

(3) By providing a feedback route whereon the bias current of the first or second differential circuit is made proportional to the output current, no current need to be flowed to any other circuit than the differential circuit for error amplification when standing by, and currents to the differential circuits increase only when the power is turned on or during operation under load, so that the required currents can be reduced when standing by while enhancing the sensitivity.

(4) By setting the offset between the first and second differential circuits so as to differentiate the channel width/channel length ratios or the threshold voltages of differential pairs of MOSFETS, a desired offset can be set in a very simple manner.

(5) By forming a precharge voltage to be given to complementary bit lines or a prescribed voltage to be given to the other electrode of the memory cell in a dynamic RAM, the dynamic RAM circuit can be simplified and its power consumption reduced.

While the invention accomplished by the present inventor has so far been described specifically with reference to preferred embodiments thereof, obviously the invention under the present application is not limited to these embodiments but various modifications are possible without deviating from its spirit and scope. For instance, the intermediate voltage may be formed from the source voltage or a reduced voltage, formed inside therefrom, by a capacitor, instead of a resistor as stated above. Or the constant voltage formed by utilizing a silicon band gap may be formed into the reference voltage by utilizing a constant current formed on the basis of this constant voltage. The present invention provides an intermediate voltage generating circuit which can be extensively used, mounted on a semiconductor integrated circuit device.

Typical advantages of the present invention hereby described can be briefly summarized as stated below. First and second output MOSFETs respectively of first and second electrical conduction types, of which the gates are supplied with the output voltage of first and second differential circuits, whose respective first input terminals are supplied with a prescribed reference voltage, the sources are respectively supplied with a first voltage higher than the reference voltage and a second voltage lower than the reference voltage, and the drains are connected to the output terminal, form an output voltage matching the reference voltage; the first and output MOSFETs are prevented from being turned on simultaneously by an offset between the first and second differential circuits; and accordingly two reference voltages of different levels need not be used, resulting in circuit simplification and a saving in power consumption.

What is claimed is:

1. A semiconductor integrated circuit device comprising a voltage generating circuit for generating an internal potential and a circuit for receiving the internal potential, said voltage generating circuit including:

a reference voltage circuit having a first output node for outputting a first potential;

a first differential amplifier having a first input node, a second input node, and a second output node, the first potential being supplied to the first input node;

a second differential amplified having a third input node, a fourth input node, and a third output node, the first potential being supplied to the third input node;

a first output MOSFET with a first conductivity type having a gate connected to the second output node, and a source-drain path connected between a second potential, higher than the first potential, and a fourth output node, the fourth output node outputting the internal potential; and a second output MOSFET with a second conductivity type having a gate connected to the third output node, and a source-drain path connected between a third potential, lower than the first potential, and the fourth output node, wherein the second and fourth input nodes are connected to the fourth output node, wherein said first differential amplifier has an offset on a lower side than the internal potential, and wherein said second differential amplifier has an offset on a higher side than the internal potential.

2. A semiconductor integrated circuit device, according to claim 1, wherein said first differential amplifier has a differential pair of first and second input MOSFETs, the first input node being connected to a gate of said first input MOSFET, and the second input node being connected to a gate of said second input MOSFET, wherein said second differential amplifier has a differential pair of third and fourth input MOSFETs, the third input node being connected to a gate of said third input MOSFET, and the fourth input node being connected to a gate of said fourth input MOSFET, wherein the offset of said first differential amplifier is set based on difference of channel width/channel length ratios of said first input MOSFET and said second input MOSFET, and wherein the offset of said second differential amplifier is set based on difference of channel width/channel length ratios of said third input MOSFET and said fourth input MOSFET.

3. A semiconductor integrated circuit device, according to claim 2, wherein each of said first and second differential amplifiers further has a feedback path for flowing a bias current proportional to the output current.

4. A semiconductor integrated circuit device, according to claim 2, wherein said voltage generating circuit further includes:

a first MOSFET and a second MOSFET, a gate of the first MOSFET being connected to the second output node, and a gate of the second MOSFET being connected to the third output node, wherein said first differential amplifier has a third MOSFET commonly connected to sources of said first and second input MOSFETs, wherein a source-drain path of said first MOSFET is connected between a gate of said third MOSFET and the second potential, wherein said second differential amplifier has a fourth MOSFET commonly connected to sources of said third and fourth input MOSFETs, and wherein a source-drain path of said second MOSFET is connected between a gate of said fourth MOSFET and the third potential.

5. A semiconductor integrated circuit device, according to claim 2, wherein the reference voltage circuit receives the third potential and a fourth potential between the second potential and the first potential, and outputs the first potential, and wherein the first potential is an intermediate potential between the fourth potential and the third potential.

6. A semiconductor integrated circuit device, according to claim 2, wherein said circuit includes:

a plurality of memory cells provided at intersection points of a plurality of word lines and a plurality of bit lines; and sense amplifiers provided corresponding to each of said plurality of bit lines and amplifying a signal read out of a corresponding one of said plurality of memory cells to the second potential or the third potential, wherein the internal potential is a potential for precharging said plurality of bit lines.

7. A semiconductor integrated circuit device, according to claim 6, wherein said plurality of memory cells are dynamic memory cells.

8. A semiconductor integrated circuit device, according to claim 2, wherein the first potential is equal to the output potential.

9. A semiconductor integrated circuit device, according to claim 1, wherein said first differential amplifier has a differential pair of first and second input MOSFETs, the first input node being connected to a gate of said first input MOSFET, and the second input node being connected to a gate of said second input MOSFET, wherein said second differential amplifier has a differential pair of third and fourth input MOSFETs, the third input node being connected to a gate of said third input MOSFET, and the fourth input node is connected to a gate of said fourth input MOSFET, wherein the offset of said first differential amplifier is set based on difference of threshold voltage of said first input MOSFET and said second input MOSFET, and wherein the offset of said second differential amplifier is set based on difference of threshold voltage of said third input MOSFET and said fourth input MOSFET.

10. A semiconductor integrated circuit device, according to claim 9, wherein each of said first and second differential amplifiers further has a feedback path for flowing a bias current proportional to the output current.

11. A semiconductor integrated circuit device, according to claim 9, wherein the reference voltage circuit receives the third potential and a fourth potential, having a value between the second potential and the first potential, and outputs the first potential, and wherein the first potential is an intermediate potential between the fourth potential and the third potential.

12. A semiconductor integrated circuit device, according to claim 9, wherein the first potential is equal to the internal potential.

13. A semiconductor integrated circuit device, according to claim 9, wherein said circuit includes:

a plurality of memory cells provided at intersection points of a plurality of word lines and a plurality of bit lines; and sense amplifiers provided corresponding to each of said plurality of bit lines and amplifying a signal read out of a corresponding one of said plurality of memory cells to the second potential or the third potential,
wherein the internal potential is a potential for pre-charging said plurality of bit lines.

14. A semiconductor integrated circuit device, according to claim 13, wherein said plurality of memory cells are dynamic memory cells.

15. A semiconductor integrated circuit comprising a voltage generating circuit for generating an internal potential and a load circuit for receiving the internal potential, said voltage generating circuit including:
a reference voltage circuit having a first output node, the first output node outputting the first potential;
a first differential amplifier having a first input node connected to the first output node, a second input node, a second output node, and first and second MOSFETs each having a source commonly connected to each other;
a second differential amplifier having a third input node connected to said first output node, a fourth input node, a third output node, and third and fourth MOSFETs each having a source commonly connected to each other;
a first output MOSFET with a first conductivity type, a gate of said first output MOSFET being connected to the second output node, a source-drain path of said first output MOSFET being connected between a second potential, higher than the first potential, and a fourth output node, the fourth output node outputting the internal potential; and
a second output MOSFET with a second conductivity type, a gate of said second output MOSFET being connected to the third output node, and a source-drain path of said second output MOSFET being connected between a third potential, lower than the first potential, and a fourth output node,
wherein the second and fourth input nodes are connected to said fourth output node,
wherein said first and second MOSFETs differ in channel width/channel length ratio, and
wherein said third and fourth MOSFETs differ in channel width/channel length ratio.

16. A semiconductor integrated circuit, according to claim 15, wherein the first input node is connected to a gate of said first MOSFET, the second input node is connected to a gate of said second MOSFET, the third input node is connected to a gate of said third MOSFET, and the fourth input node is connected to a gate of said fourth MOSFET.

17. A semiconductor integrated circuit, according to claim 16, wherein the first potential is equal to the internal potential.

18. A semiconductor integrated circuit, according to claim 16, wherein said load circuit includes:

a plurality of memory cells provided at intersection points of a plurality of word lines and a plurality of bit lines; and sense amplifiers provided corresponding to each of said plurality of bit lines and amplifying a signal read out of a corresponding one out of said plurality of memory cells to the second potential or the third potential,
wherein the internal potential is a potential for pre-charging said plurality of bit lines.

19. A semiconductor integrated circuit, according to claim 18, wherein said plurality of memory cells are dynamic memory cells.

20. A semiconductor integrated circuit device, according to claim 2, wherein the first and second input MOSFETs are of the second conductivity type and the third and fourth input MOSFETs are of the first conductivity type, respectively.

21. A semiconductor integrated circuit device, according to claim 4, wherein the first MOSFET is of the first conductivity type and the second MOSFET is of the second conductivity type.

22. A semiconductor integrated circuit, according to claim 15, wherein the first and second MOSFETs are of the second conductivity type and the third and fourth MOSFETs are of the first conductivity type, respectively.

23. A semiconductor integrated circuit device, according to claim 1, wherein the reference voltage circuit includes a pair of series-connected MOSFETs, each having a gate connected to a drain thereof and the first output node thereof corresponds to a common node of the series-connected MOSFETs.

24. A semiconductor integrated circuit, according to claim 15, wherein the reference voltage circuit includes a pair of series-connected MOSFETS, each having a gate connected to a drain thereof and the first output node thereof corresponds to a common node of the series-connected MOSFETs.

* * * * *